(12) United States Patent
Nakayama et al.

(10) Patent No.: US 8,080,182 B2
(45) Date of Patent: *Dec. 20, 2011

(54) OXIDE SINTERED BODY AND AN OXIDE FILM OBTAINED BY USING IT, AND A TRANSPARENT BASE MATERIAL CONTAINING IT

(75) Inventors: Tokuyuki Nakayama, Ichikawa (JP); Yoshiyuki Abe, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/560,887

(22) Filed: Sep. 16, 2009

(65) Prior Publication Data

US 2010/0009157 A1 Jan. 14, 2010

Related U.S. Application Data

(62) Division of application No. 11/604,259, filed on Nov. 27, 2006, now Pat. No. 7,611,646.

(30) Foreign Application Priority Data

Feb. 8, 2006 (JP) ................................. 2006-031201

(51) Int. Cl.
H01B 1/08 (2006.01)

(52) U.S. Cl. .................. 252/518.1; 252/519.1; 501/126; 423/624; 204/192.29; 430/530; 430/63; 430/527; 430/496; 430/41; 430/220; 428/432; 428/426; 428/698; 428/701; 428/702

(58) Field of Classification Search ............... 252/518.1, 252/519.1; 501/126; 423/624; 204/192.29; 430/530, 63, 527, 496, 41, 220; 428/432, 428/426, 698, 701, 702

See application file for complete search history.

(56) References Cited

U.S. PATENT DOCUMENTS

| | | | | |
|---|---|---|---|---|
| 5,407,602 | A | | 4/1995 | Cava |
| 5,473,456 | A | * | 12/1995 | Cava et al. ..................... 349/139 |
| 5,538,767 | A | * | 7/1996 | Cava et al. ..................... 427/596 |
| 6,284,393 | B1 | | 9/2001 | Hosokawa et al. |
| 6,537,667 | B2 | | 3/2003 | Watanabe et al. |
| 6,669,830 | B1 | | 12/2003 | Inoue et al. |
| 6,911,163 | B2 | * | 6/2005 | Abe ............................ 252/521.3 |
| 7,476,343 | B2 | | 1/2009 | Nakayama et al. |
| 7,507,357 | B2 | | 3/2009 | Abe et al. |
| 7,563,514 | B2 | * | 7/2009 | Nakayama et al. ............ 428/432 |
| 7,611,646 | B2 | * | 11/2009 | Nakayama et al. ......... 252/518.1 |
| 2004/0137280 | A1 | * | 7/2004 | Abe et al. ..................... 428/702 |
| 2007/0051926 | A1 | | 3/2007 | Nakayama et al. |
| 2007/0200100 | A1 | | 8/2007 | Nakayama et al. |
| 2008/0032106 | A1 | | 2/2008 | Nakayama et al. |
| 2008/0038529 | A1 | | 2/2008 | Nakayama et al. |
| 2009/0123724 | A1 | * | 5/2009 | Nakayama et al. ............ 428/220 |
| 2010/0129660 | A1 | * | 5/2010 | Nakayama et al. ............ 428/412 |

FOREIGN PATENT DOCUMENTS

| | | | |
|---|---|---|---|
| JP | 51-56998 | | 5/1976 |
| JP | 51056998 A | * | 5/1976 |
| JP | 07-182924 | | 7/1995 |
| JP | 08-264023 | | 10/1996 |
| JP | 09-259640 | | 10/1997 |
| JP | 10-083719 | | 3/1998 |
| JP | 10-294182 | | 11/1998 |
| JP | 2002-093243 | | 3/2002 |
| JP | 2002-313141 | | 10/2002 |
| JP | WO 2005083722 A1 | * | 9/2005 |
| JP | 2006022373 | | 1/2006 |
| WO | WO 2006030762 A1 | * | 3/2006 |

OTHER PUBLICATIONS

Mukai et al., "White and UV LEDs", Applied Physics, vol. 68, No. 2, Feb. 1999, pp. 152-155, The Japan Society of Applied Physics.
Akita et al., "Effects of GaN Substrates on ultraviolet Light Emitting Diodes", SEI Technical Reviews, No. 165, Sep. 2004, pp. 75-80, Sumitomo Electric Industries Ltd. (partial translation).
T. Minami et al., J. Vac. Sci, A14(3), May/Jun. 1996, pp. 1689-1693.
T. Minami et al., J. Vac. Sci, A17(4), Jul./Aug. 1999, pp. 1765-1772.
"Transparent Conducting Thin Films of GaInO3", Julia M. Philips et al., Applied Physics Letters, vol. 65, Nos. 1-4, pp. 115-117, 1994.
U.S. Appl. No. 12/314,238, filed Dec. 5, 2008 for "GA-IN-O Amorphous Oxide Transparent Conductive Film, and Transparent Conductive Base Material Comprising This Conductive Film Formed Thereon".
Hiroshi Kimura, et al., DC Magnetron Sputtered ITO Films Applied with Indium Tin Oxide Targets, Electronic Materials Research Laboratory, Mitsui Mining and Smelting Co., Japan, Nov. 10, 2006.
Yue Long Li, et al., Indium Zinc Oxide Thin Films Deposited by Radio Frequency Magnetron Sputtering for Fabrication of Flexible Dye Sensitized Solar Cell, Applied Chemistry, vol. 11, No. 2, Nov. 2007, pp. 606-609.
Xifeng Li, et al., Development of Novel Tungsten-doped High Mobility Transparent Conductive In2O3 Thin Films, Journal of Vacuum Science and Technology, A 24(5), Sep./Oct. 2006.

* cited by examiner

*Primary Examiner* — Douglas McGinty
(74) *Attorney, Agent, or Firm* — Smith, Gambrell & Russell, LLP

(57) ABSTRACT

The oxide sintered body mainly consists of gallium, indium, and oxygen, and a content of the gallium is more than 65 at. % and less than 100 at. % with respect to all metallic elements, and the density of the sintered body is 5.0 g/cm$^3$ or more. The oxide film is obtained using the oxide sintered body as a sputtering target, and the shortest wavelength of the light where the light transmittance of the film itself except the substrate becomes 50% is 320 nm or less. The transparent base material is obtained by forming the oxide film on one surface or both surfaces of a glass plate, a quartz plate, a resin plate or resin film where one surface or both surfaces are covered by a gas barrier film, or on one surface or both surfaces of a transparent plate selected from a resin plate or a resin film where the gas barrier film is inserted in the inside.

7 Claims, 2 Drawing Sheets

Fig. 1

| | Target evaluation | | | | | |
|---|---|---|---|---|---|---|
| | Ga: atomic ratio [%] | Normal pressure : sintering temperature [°C] | Sintered body density [g/cm³] | Phase | $In_2O_3p(400)$ intensity ratio [%] | Direct current sputtering yes /no |
| Embodiment 1 | 65.6 | 1400 | 6.04 | $\beta$-$GaInO_3$ | 0 | ○ |
| Embodiment 2 | 65.2 | 1500 | 6.12 | $(Ga, In)_2O_3$ | 0 | ○ |

Fig. 2

| | Target evaluation | | | | | |
|---|---|---|---|---|---|---|
| | Ga: atomic ratio [%] | Normal pressure : sintering temperature [°C] | Sintered body density [g/cm³] | Phase | $In2O3p(400)$ intensity ratio [%] | Direct current sputtering yes/no |
| Comparative example 1 | 58.3 | 1400 | 6.28 | $\beta$-$GaInO_3$, $In_2O_3$ | 7 | ○ |

Fig. 3

| | Target evaluation | | | | | |
|---|---|---|---|---|---|---|
| | Ga: atomic ratio [%] | HP:sintering temperature [°C] | Sintered body density [g/cm³] | Phase | $In2O3p(400)$ intensity ratio [%] | Direct current sputtering yes/no |
| Embodiment 3 | 65.4 | 800 | 5.85 | $\beta$-$GaInO_3$ | 0 | ○ |
| Embodiment 4 | 65.4 | 900 | 6.08 | $\beta$-$GaInO_3$ | 0 | ○ |
| Embodiment 5 | 65.9 | 1000 | 6.12 | $\beta$-$GaInO_3$, $In_2O_3$ | 5 | ○ |
| Embodiment 6 | 79.8 | 900 | 5.72 | $\beta$-$Ga_2O_3$, $\beta$-$GaInO_3$ | 0 | ○ |
| Embodiment 7 | 89.9 | 900 | 5.51 | $\beta$-$Ga_2O_3$, $\beta$-$GaInO_3$ | 0 | ○ |
| Embodiment 8 | 99.1 | 900 | 5.02 | $\beta$-$Ga_2O_3$ | 0 | × |

Fig. 4

| | Target evaluation | | | | | |
|---|---|---|---|---|---|---|
| | Ga:atomic ratio [%] | HP:sintering temperature [°C] | Sintered body density [g/cm³] | Phase | $In2O3p(400)$ intensity ratio [%] | Direct current sputtering yes /no |
| Comparative example 2 | 65.3 | 1100 | 4.89 | $\beta$-$GaInO_3$, $In_2O_3$ | 12 | × |

Fig.5

| | Thin film evaluation | | | |
|---|---|---|---|---|
| | Substrate temperature [°C] | Ga:atomic ratio [%] | The shortest wavelength at light transmittance 50% except substrate [nm] | Ra [nm] |
| Embodiment 9 | 25 | 65.6 | 318 | 0.49 |
| Embodiment 10 | 25 | 65.2 | 320 | 0.51 |

Fig..6

| | Thin film evaluation | | | |
|---|---|---|---|---|
| | Substrate temperature [°C] | Ga:atomic ratio [%] | The shortest wavelength at light transmittance 50% except substrate [nm] | Ra [nm] |
| Comparative example 3 | 25 | 58.7 | 332 | 0.55 |

Fig. 7

| | Thin film evaluation | | | |
|---|---|---|---|---|
| | Substrate temperature [°C] | Ga:atomic ratio [%] | The shortest wavelength at light transmittance 50% except substrate [nm] | Ra [nm] |
| Embodiment 11 | 25 | 65.5 | 318 | 0.48 |
| Embodiment 12 | 25 | 79.7 | 296 | 0.52 |
| Embodiment 13 | 25 | 90.2 | 284 | 0.51 |
| Embodiment 14 | 25 | 99.5 | 269 | 0.51 |

Fig. 8

| | Thin film evaluation | | | |
|---|---|---|---|---|
| | Substrate temperature [°C] | Ga:atomic ratio [%] | The shortest wavelength at light transmittance 50% except substrate [nm] | Ra [nm] |
| Comparative example 4 | 25 | 59.7 | 340 | 0.62 |

Fig. 9

| | Thin film evaluation | | | |
|---|---|---|---|---|
| | Substrate temperature [°C] | Ga:atomic ratio [%] | The shortest wavelength at light transmittance 50% except substrate [nm] | Ra [nm] |
| Embodiment 15 | 25 | 65.1 | 320 | 0.54 |

OXIDE SINTERED BODY AND AN OXIDE FILM OBTAINED BY USING IT, AND A TRANSPARENT BASE MATERIAL CONTAINING IT

CROSS REFERENCE TO RELATED APPLICATION

This application is a division of Ser. No. 11/604,259, filed Nov. 27, 2006, now U.S. Pat. No. 7,611,646, and which is incorporated herein by reference in its entirety. This application also claims the benefit of Japanese Application No. 2006-31201, filed in Japan on Feb. 8, 2006, the contents of which are incorporated herein by reference in its entirety.

BACKGROUND OF THE INVENTION

1. Field of the Invention

The present invention relates to an oxide sintered body which mainly consists of gallium, indium, and oxygen, and a transparent base material comprising an oxide film obtained using the oxide sintered body and its oxide film.

In particular, it relates to a transparent base material comprising an oxide sintered body having a low content of an indium oxide phase, and an oxide film with high light transmittance at a near-ultraviolet region wherein a film is formed by using the oxide sintered body as a sputtering target.

2. Description of the Related Art

Since a transparent conductive oxide film is excellent in electrical conductivity and light transmittance in a visible region, it has been used as a transparent electrode of various devices.

As a practical thing, tin oxide ($SnO_2$) which contains antimony and fluorine as a dopant, zinc oxide (ZnO) which contains aluminium and gallium as a dopant, indium oxide ($In_2O_3$) which contains Sn as a dopant etc., have been known.

Especially, among them, the indium oxide film which contains Sn as dopant is called ITO (Indium-Tin-Oxide) film, and it has been extensively used since the transparent conductive oxide film having low resistance can be obtained easily.

As a method of forming a transparent conductive oxide film, the sputtering method, the evaporation method, the ion plating method, and the chemical solution coating method have been used widely.

Among such methods, a sputtering method is an effective method, when using material with a low vapor pressure, or when precise film thickness control is needed.

In the sputtering method, generally, argon gas is used under gas pressure of about 10 Pa or less, a substrate is used as an anode, and a sputtering target which is a raw material of the transparent conductive oxide film to be formed as a cathode and voltage is supplied to them.

Between the electrodes to which voltage is applied, glow discharge occurs, and then argon plasma occurs, and argon ions in plasma collide with the sputtering target of the cathode.

Particles which are flipped one after another off by this collision are deposited one by one on the substrate, and a thin film is formed.

The sputtering method is classified according to generating method of argon plasma. A method using plasma generated by high frequency power is called as RF sputtering method, and a method using plasma generated by direct current power is called as direct current sputtering method.

Especially, the direct current sputtering method is an optimal film forming method since it has such features that there are less heat damages to a substrate, high-speed film forming is possible, power supply equipment is cheap, and operation is simple and so on.

Generally, the direct current sputtering method is used for formation of ITO film.

The ITO film formed at room temperature shows low specific resistance of $5 \times 10^{-4}$ $\Omega \cdot cm$.

The ITO film is good also about the light transmittance of a visible region, and has the light transmittance of an average of 80% or more.

Moreover, it is excellent at chemical and thermal stability.

The luminescent material and luminescence device which have a function of near-ultraviolet light luminescence (for example, wavelength of 300 nm~400 nm) (for example, LED, laser, organic or inorganic EL) have been widely used and these development have been made briskly (with respect to a near-ultraviolet LED, refer to Applied physics, volume 68 (1999), No. 2, pp. 152-155, and SEI Technical Review, September, 2004 (No. 165), and pp. 75~78) Applied physics, the 68th volume (1999), No. 2, pp. 152~155 and the SEI technical review, the September, 2004 (No. 165), and pp. 75~78)

A transparent electrode is indispensable to these electron devices also.

In a conventional luminescence device in which importance is given to visible light with wavelength of 400 nm~800 nm, the ITO film and the transparent conductive oxide film of ZnO and the like or $SnO_2$ and the like have been used as a transparent electrode.

These conventional transparent conductive oxide films had characteristics such that an average transmittance of a visible light with wavelength of 400 nm~800 nm is excellent, but to a near ultraviolet light with wavelength that was short wave less than 400 nm, transmittance was not sufficient since an absorption occurs at the wavelength of 400 nm.

The following proposals have been made for a transparent conductive oxide film applied to a luminescent material or a luminescence device (for example, LED, laser, organic or inorganic EL) which has a luminescence function of the near-ultraviolet light (for example, wavelength of 300 nm-400 nm).

In Japanese published unexamined patent application Toku Kai Hei 7-182924, it has been proposed that gallium indium oxide ($GaInO_3$) which is doped by a little amount of different valent dopants like a quadrivalent ion.

It is disclosed that since a crystal film of this oxide is excellent at transparency and has low refractive index of about 1.6, refractive-index consistency with a glass substrate is improved, and furthermore, electrical conductivity comparable as that of a broad prohibition area semiconductor which has been currently used can be realized. However, as for the crystal film disclosed there, absorption of a near-ultraviolet light occurs, and it is difficult to use it industrially without improvement since film forming at a high temperature, that is, a substrate temperature of 250° C.~500° C. is required.

In Published Unexamined Patent Application Toku Kai 2002-093243, an ultraviolet transparent conductive oxide film has been proposed, and it has been disclosed that the ultraviolet transparent conductive oxide film is characterized in that it consists of $Ga_2O_3$ crystal, and in the range of the wavelength of 240 nm~800 nm, or wavelength (240 nm~400 nm), it is transparent, and has electrical conductivity owing to an oxygen defect or a dopant element, and manufacturing is carried out by using one of methods of pulsed laser deposition method, sputtering method, CVD method, and MBE method under such condition that one element or more elements of Sn, Ge, Si, Ti, Zr, Hf, V, Nb, Ta, Cr, Mo, and W is used as a dopant, and a substrate temperature is set at 600° C.~1500° C., and oxygen partial pressure is set at 0~1 Pa, have been shown.

In order to acquire electrical conductivity, it is necessary to form a film of $Ga_2O_3$ crystal film shown in the above, at a substrate temperature of 600° C.~1500° C.

Since this temperature range is too high, industrial use is very difficult.

Recently, inventors of the present invention have found, as disclosed in the patent application No. 2005-252788, a new transparent conductive thin laminated film, which has not only a high transmittance in a visible region, and a low surface resistance (6Ω/□~500Ω/□), but also has a high light transmittance in a visible light short wavelength region with wavelength of 380 nm~400 nm and also in a near-ultraviolet light region (300 nm~380 nm) of short wavelength.

Namely, the inventors have found out that the above-mentioned subject can be solved, by having paid attention to a transparent conductive film having a lamination structure in which a surface of a metal thin film is covered by a transparent thin film of oxide, in a transparent conductive film wherein the transparent thin film of oxide is thin film of an amorphous oxide which mainly consists of gallium, indium, and oxygen, or the transparent thin film of the amorphous oxide which mainly consists of gallium and oxygen, and the gallium contained in the transparent thin film of oxide is contained at a rate 35 at. % or more, and less than 100 at. % to all metal atoms.

SUMMARY OF THE INVENTION

The object of the present invention is to provide an oxide film having a high light transmittance in a near-ultraviolet light region where a shortest wavelength in which the light transmittance of the film itself becomes 50% or more is 320 nm or less, or an oxide sintered body which can be used for a sputtering target required for obtaining the oxide film, and furthermore a transparent base material containing the obtained oxide film.

After having eagerly studied various kinds of oxide sintered bodies in order to attain such purposes, the inventors of the present invention have found that an oxide sintered body which mainly consists of gallium, indium, and oxygen, wherein a content of the gallium is more than 65 at. % and less than 100 at. % with respect to all metallic elements, and a content of the gallium is preferably more than 65 at. % and 90 at. % or less with respect to all metallic elements, is very useful as a source of oxide film formation.

The inventors have found that when an oxide film is formed by a sputtering method by using this oxide sintered body as a sputtering target for example, an amorphous oxide film wherein the oxide film which mainly consists of gallium, indium and oxygen, and a content of the gallium is more than 65 at. % and less than 100 at. % with respect to all metallic elements, and a content of the gallium is preferably more than 65 at. % and 90 at. % or less with respect to all metallic elements, is an oxide film in which a shortest wavelength, where the light transmittance of the film itself becomes 50%, is 320 nm or less.

Furthermore, in order to obtain such an oxide film, the inventors have found out that it is necessary to form a film using the sputtering target which can control generation of a indium oxide phase ($In_2O_3$ phase) of the bixbyite type structure which causes decrease of light transmittance of an oxide film at a wavelength of 400 nm or less, and eventually they have invented the present invention.

Namely, the first invention of the present application provides an oxide sintered body characterised in that it mainly consists of gallium, indium, and oxygen, wherein a content of the gallium is more than 65 at. % and less than 100 at. % with respect to all metallic elements, and a density of the sintered body is 5.0 g/cm³ or more The second invention of the present application provides the oxide sintered body of the claim 1, wherein a content of the gallium is more than 65 at. % and 90 at. % or less with respect to all metallic elements, and a density of the sintered body is 5.5 g/cm³ or more and when it is used as a sputtering target, it is possible to form a film by the direct current sputtering method.

The third invention of the present application provides the oxide sintered body of the claim 1 or 2, wherein it is constituted by one phase or more selected from a gallium-oxide phase which has β-$Ga_2O_3$ type structure (β-$Ga_2O_3$ phase), a gallium-indium-oxide phase having β-$Ga_2O_3$ type structure (β-$GaInO_3$ phase) or (Ga, In)$_2O_3$ phases.

The fourth invention of the present application provides the oxide sintered body according to the claim 1 or 2, wherein it is constituted by one phase or more phases selected from a gallium oxide phase which has β-$Ga_2O_3$ type structure (β-$Ga_2O_3$ phase), an oxide of gallium indium phase having β-$Ga_2O_3$ type structure (β-$GaInO_3$ phase), or (Ga, In)$_2O_3$ phases, and it is constituted by an indium oxide phase ($In_2O_3$ phase) of bixbyite-type structure, a ratio in which the indium oxide phase ($In_2O_3$ phase) of the bixbyite-type structure is contained is 5% or less in term of X-ray diffraction peak intensity ratio defined by the following formula (1).

$$In_2O_3 \text{ phase } (400)/\{β\text{-}Ga_2O_3 \text{ phase } (-202)+β\text{-}GaInO_3 \text{ phase}(111)+(Ga,In)_2O_3 \text{ phase } (2θ≈33°)\}×100[\%] \quad (1)$$

The fifth invention of the present application provides the oxide sintered body according to the claims 1 to 4, wherein the sintered oxide is sintered by a hot pressing method under an inert gas atmosphere, at 800° C.~1000° C. of sintering temperature and under condition of pressure 4.9 MPa~29.4 MPa, and it does not have a metal indium phase.

The sixth invention of the present application provides an oxide film characterised in that the oxide film is obtained by the sputtering method, using one of the oxide sintered body according to the first to fifth invention as a sputtering target and it is an oxide film which mainly consists of gallium, indium, and oxygen, and it has a gallium, and a content of the gallium is more than 65 at. % and less than 100 at. % with respect to all metallic elements, and a shortest wavelength, where the light transmittance of the film itself excluding a substrate becomes 50%, is 320 nm or less.

The seventh invention of the present application provides the oxide film according to the sixth invention characterized in that the oxide film is an amorphous film.

The eighth invention provides the oxide film according to the sixth or seventh invention characterized in that the arithmetic mean height (Ra) is 1.0 nm or less.

The ninth invention of the present application provides an transparent base material characterized in that an oxide film of one of the sixth to eighth inventions is formed on a glass plate, a quartz plate, a resin plate or resin film where one surface or both surfaces are covered by a gas barrier film, or on one surface or both surfaces of a transparent plate selected from a resin plate or a resin film where the gas barrier film is inserted in the inside.

The tenth invention of the present application provides the transparent base material of the ninth invention characterized in that the gas barrier film is constituted by one film or more films selected from an silicon oxide film, an silicon oxide nitride (SiON) film, an aluminum acid magnesium film, a tin oxide type film, and a diamond-like carbon (DLC) film.

The eleventh invention of the present application provides the transparent base material according to the tenth invention characterised in that a material of the resin plate or the resin film comprises polyethylene terephthalate (PET), polyether sulfone (PES), polyarylate (PAR), polycarbonate (PC), polyethylenen aphthalate (PEN) or a lamination structure where a surface of such materials is covered by acrylic organic substance.

According to the present invention, an oxide sintered body which enables to be used as a sputtering target and form an oxide film which transmits near-ultraviolet light can be obtained. So far, such oxide sintered body cannot have been obtained.

Such oxide film obtained by the present invention, by laminating with a metal film, can be used as an electrode of a device using LED or laser or, organic or inorganic EL for blue light but also a near-ultraviolet light.

Since it becomes possible to obtain high light transmittance in a visible light short wavelength region and a near-ultraviolet light region of wavelength used, it is industrially useful.

Further, when it is used as an electrode for a self-luminescence type element, such as an organic EL device, an extraction efficiency of the light of a visible light short wavelength region and also a near-ultraviolet light can be raised. Extraction efficiency can be raised.

Furthermore, an oxide film of the present invention, has an advantage that by using the sputtering method, especially the direct current sputtering method which is a thin film producing method used extensively industrially, it can be formed also on a substrate in which the film forming is required at low temperature (room temperature ~100° C.).

These and other objects as well as the features and advantages of the present invention will become apparent from the detailed description of the preferred embodiments when taken in conjunction with the accompanying drawings.

BRIEF DESCRIPTION OF THE DRAWINGS

FIG. 1 is a table showing target evaluation of embodiments 1 and 2 of a sintered body according to the present invention.

FIG. 2 is a table showing target evaluation of a first comparative example of the sintered body.

FIG. 3 is a table showing target evaluation of a third to eight embodiments of the sintered body according to the present invention.

FIG. 4 is a table showing target evaluation of the second comparative example of the sintered body.

FIG. 5 is a table showing thin film evaluation of embodiments 9 and 10 of the oxide film according to the present invention.

FIG. 6 is a table showing thin film evaluation of a third comparative example of the oxide film.

FIG. 7 is a table showing thin film evaluation of embodiments 11 to 14 of the oxide film according to the present invention.

FIG. 8 is a table showing thin film evaluation of a fourth comparative example of the oxide film.

FIG. 9 is a table showing thin film evaluation of embodiment 15 of the oxide film according to the present invention.

DETAILED DESCRIPTION OF THE PREFERRED EMBODIMENTS

The oxide sintered body, the oxide film, and the transparent base material containing it according to the present invention will be explained in detail hereafter. However, the present invention is not limited to the following embodiments.

The oxide sintered body according to the present invention, comprises an oxide sintered body which mainly consists of gallium, indium, and oxygen, wherein a content of the gallium is more than 65 at. % and less than 100 at. % with respect to all metallic elements, and the density of the oxide sintered body is 5.0 g/cm$^3$ or more.

Further, the oxide sintered body comprises gallium, a content of which is more than 65 at. % and 90 at. % or less with respect to all metallic elements, and the density of the sintered body is 5.5 g/cm$^3$ or more, and when it is used as a sputtering target, it is possible to form a film by a direct current sputtering method.

Furthermore, the oxide sintered body according to the present invention is an oxide sintered body which mainly consists of gallium, indium, and oxygen. However, if it is mainly constituted by the above-mentioned elements, other inevitable impurity can be included.

It is desired that the above-mentioned oxide sintered body is constituted by one phase or more phases selected from a gallium-oxide phase which has $\beta$-$Ga_2O_3$ type structure ($\beta$-$Ga_2O_3$ phase), a gallium-indium-oxide phase having $\beta$-$Ga_2O_3$ type structure ($\beta$-$GaInO_3$ phase), or $(Ga, In)_2O_3$ phases.

When the oxide sintered body has one phase or more phases selected from a gallium-oxide phase which has $\beta$-$Ga_2O_3$ type structure ($\beta$-$Ga_2O_3$ phase), a gallium-indium-oxide phase which has $\beta$-$Ga_2O_3$ type structure ($\beta$-$GaInO_3$ phase), or $(Ga, In)_2O_3$ phase phases, and it is constituted by an indium oxide phase ($In_2O_3$ phase) of bixbyite type structure, it is desirable that a ratio in which the indium oxide phase ($In_2O_3$ phase) of the bixbyite type structure is contained is 5% or less in term of X-ray diffraction peak intensity ratio defined by the following formula (1).

$$In_2O_3 \text{ phase } (400)/\{\beta\text{-}Ga_2O_3 \text{ phase } (-202)+\beta\text{-}GaInO_3 \text{ phase } (111)+(Ga,In)_2O_3 \text{ phase } (2\theta\approx 33°)\}\times 100 \text{ [\%]} \quad (1)$$

Here, information concerning the structure of each phase, has been clearly shown by JCPDS cards which are 41-1103 ($\beta$-$Ga_2O_3$ phase), 21-0334 ($\beta$-$GaInO_3$ phase), 14-0564(($Ga, In)_2O_3$ phase), and 06-0416 ($In_2O_3$ phase).

Main peaks of $\beta$-$GaInO_3$ phase and $In_2O_3$ phase in X-ray diffraction, are based on (111) reflection and (222) reflection, respectively, but, since $In_2O_3$ phase (222) reflection laps with $\beta$-$GaInO_3$ phase (002) reflection, with respect to $In_2O_3$ phase it is evaluated by (400) reflection having the next highest intensity.

The oxide sintered body which does not have a metal indium phase can be obtained by sintering the oxide sintered body in an inert gas atmosphere, at 800° C.~1000° C. of sintering temperature by a hot pressing method, and under the condition of pressure 4.9 MPa~29.4 MPa, When an oxide film is formed by the sputtering method, using these oxide sintered bodies as a sputtering target for example, it is possible to obtain an oxide film such that it has a composition range wherein it mainly consists of gallium, indium and oxygen, and a content of the gallium is more than 65 at. % and less than 100 at. % with respect to all metallic elements, and more preferably, more preferably has a composition range wherein a content of gallium is more than 65 at. % and 90 at. % or less with respect to all metallic elements, and a shortest wavelength is 320 nm or less, where the light transmittance of the film itself except a substrate is 50%.

Furthermore, in order to obtain the above-mentioned oxide film, it is desired that a film is formed using as a sputtering target, an oxide sintered body in which generation of an indium oxide phase (In$_2$O$_3$ phase) of the bixbyite type structure, which causes fall of the light transmittance of an oxide film in the region of the wavelength of 400 nm or less, is suppressed.

The oxide sintered body according to the present invention mainly consists of gallium, indium and oxygen, and a content of the gallium is more than 65 at. % and less than 100 at. % with respect to all metallic elements, and it is required that it is in a composition range excluding gallium-oxide.

Furthermore, it is required that the density of the oxide sintered body is 5.0 g/cm$^3$ or more.

Here, when a content of gallium is 65 at. % or less, to all metallic elements, and an oxide film is formed by using this oxide sintered body as a sputtering target for example, a shortest wavelength where the light transmittance of the film itself except a substrate is 50% exceeds 320 nm.

Since sintering becomes remarkably difficult in a composition range of gallium-oxide, it becomes difficult to obtain a high-density oxide sintered body.

When sputtering is performed by using an oxide sintered body that has not yet become high density, as a sputtering target, a problem occurs, namely, abnormal electric discharge of arc discharge etc. occur frequently, and consequently, the shortest wavelength where the light transmittance of the film itself except a substrate becomes 50% is 320 nm or less. Therefore, good quality oxide film cannot be obtained.

When the oxide sintered body having the density of the sintered body less than 5.0 g/cm$^3$ is used as a sputtering target, generation of nodule and generating of arc discharge in long-time use occur, and film characteristics of the oxide film obtained get worse.

Furthermore, in the oxide sintered body according to the present invention, it is more desired that it contains gallium content of which is more than 65 at. % and 90 at. % or less with respect to all metallic elements, and the density of the sintered body is 5.5 g/cm$^3$ or more, and when it is used as a sputtering target, forming of a film can be made by a direct current sputtering method.

The reason is that since an oxide sintered body in this range has sufficient conductivity and the density of the sintered body, abnormal electrical discharge of arc discharge etc. does not occur, and accordingly the direct current sputtering can be carried out successfully.

In a direct current sputtering method mentioned here, a sputtering method (direct current pulsing method) in which a negative voltage applied to a target is ceased periodically, and during the period, by applying a low positive voltage, neutralization of positive charging is carried out by electrons is also included.

The direct current pulsing method is desirable, since it has advantages such that a film can be formed while controlling arcing in a reactive sputtering using reactant gas of oxygen, and control of impedance consistency circuit like in the RF sputtering method is not required, and, film forming speed is quicker than that of the RF sputtering method.

Further, it is desired that the oxide sintered body according to the present invention is constituted by one or more phases selected from a gallium-oxide phase which has β-Ga$_2$O$_3$ type structure (β-Ga$_2$O$_3$ phase), a gallium-indium-oxide phase having β-Ga$_2$O$_3$ type structure (β-GaInO$_3$ phase), or (Ga, In)$_2$O$_3$ phases.

Furthermore, it is desired that the oxide sintered body according to the present invention is constituted by one or more phases selected from a gallium-oxide phase which has β-Ga$_2$O$_3$ type structure (β-Ga$_2$O$_3$ phase), a gallium-indium-oxide phase having β-Ga$_2$O$_3$ type structure (β-GaIn O$_3$ phase), or (Ga,In)$_2$O$_3$ phases, wherein it is constituted by an indium oxide phase (In$_2$O$_3$ phase) of bixbyite-type structure, a ratio in which the indium oxide phase (In$_2$O$_3$ phase) of the bixbyite-type structure is contained is 5% or less in term of X-ray diffraction peak intensity ratio defined by the following formula (1).

$$\text{In}_2\text{O}_3\text{phase}(400)/\{\beta\text{-Ga}_2\text{O}_3\}\text{phase}(-202)+\beta\text{-}\beta\text{-GaInO}_3\text{phase}(111)+(\text{Ga, In})_2\text{O}_3\text{ phase} (2\theta\approx 33°)\}\times 100[\%] \quad (1)$$

If the X-ray diffraction peak intensity ratio of the formula is 5% or more, since a contribution to optical characteristics of the oxide film by the indium oxide phase (In$_2$O$_3$ phase) having a bixbyite-type structure of a sputtering target is large, a shortest wavelength where the light transmittance of the film itself except a substrate is 50% exceeds 320 nm.

Here, as for the indium oxide phase (In$_2$O$_3$ phase) of bixbyite-type structure, it may be that in which oxygen deficit has been introduced, or a part of indium has been replaced by gallium. And, as for β-Ga$_2$O$_3$ phase, it may be that in which oxygen deficit has been introduced, or it may be that in which a part of gallium has been replaced by indium.

As for β-GaInO$_3$ phase and (Ga,In)$_2$O$_3$ phase, they may be those in which oxygen deficit is introduced, or in which the atomic ratio of gallium to indium is somehow shifted from their stoichiometry.

The oxide sintered body according to the present invention is desirable, since an oxide sintered body which does not contain a metal indium phase is obtained according to the oxide sintered body, wherein the oxide sintered body is sintered by the hot pressing method, and the sintering condition is such that in an inert gas atmosphere, sintering temperature is 800° C.~1000° C. and pressure is 4.9 MPa~29.4 MPa.

Sintering is not fully carried out at a sintering temperature less than 800° C. in an inert gas, but when it exceeds 1000° C., metal indium is melted and it will ooze out.

The range of a pressure of 4.9 MPa~29.4 MPa is desirable. When a pressure is lower than this range, the sintering is not carried out enough. Therefore, good quality oxide sintered body with high density cannot be obtained.

Even when the pressure is set at higher than this range, the density of the sintered body is not improved, and breakage of a mold used for the hot pressing occurs easily.

Furthermore, an oxide film of the present invention is an oxide film obtained using the sputtering method, wherein the oxide sintered body is used as a sputtering target, and mainly consists of gallium, indium, and oxygen. The oxide film contains gallium, a content of which is more than 65 at. % and less than 100 at. % with respect to all metallic elements, and it has an outstanding characteristics such that a shortest wavelength is 320 nm or less, where the light transmittance of the film itself except a substrate is 50%. When a content of gallium is 65 at. % or less, to all metallic elements, as for the oxide film obtained, a shortest wavelength where the light transmittance of the film itself except a substrate is 50% exceeds 320 nm.

Film of gallium oxide is not desirable, since as for the film of gallium oxide, it is difficult to obtain a high-density sintered body as mentioned above, and accordingly, it is difficult to obtain an oxide film having the shortest wavelength where the light transmittance of the film itself except a substrate is 50% becomes 320 nm or less.

It is desired that the oxide film according to the present invention is obtained by the direct current sputtering method which is an advantageous film forming method industrially.

It is desired that the oxide film of the present invention is an amorphous film.

This is because the amorphous film has a good etching nature as compared with a crystalline substance film, and, it is because a flatness nature of the emulsion surface, which is considered important in an electrode used especially for organic electroluminescence (EL), is excellent.

Furthermore, in the oxide film of the present invention, it is desired that the arithmetic mean height (Ra) is 1.0 nm or less. Here, the arithmetic mean height (Ra) is based on the definition of JIS B0601-2001.

When the arithmetic mean height (Ra) exceeds 1.0 nm, it is not desirable in a particular use in which the flatness nature of an emulsion surface is required, such as organic EL.

The transparent base material of the present invention can be obtained by forming the oxide film of the present invention mentioned above on one surface side or both surface sides of a glass plate, a quartz plate, a resin plate or resin film where one side or both sides are covered by a gas barrier film, a transparent plate which were selected from a resin plate or a resin film where the gas barrier film is inserted in the inside.

A thin film transistor (TFT) and a metal electrode for driving it can be formed on the transparent plate mentioned above, as long as the transparency of a substrate is not completely spoiled.

The above-mentioned resin plate or a resin film has the high permeability of gas compared with a glass plate, on the other hand, a luminescence layer of an organic EL device or inorganic EL element deteriorates by moisture or oxygen, when the resin plate or the resin film is used as a substrate of these display elements, it is desirable to give a gas barrier film which suppresses passage of gas.

As the gas barrier film, it is desirable to form one film or more films between a transparent plate and an oxide film.

It is desired that the gas barrier film is one film or more films selected from a silicon oxide film, an silicon oxide nitride (SiON) film, an aluminum acid magnesium film, a tin oxide type film, and a diamond-like carbon (DLC) film.

Further, not only an inorganic film but also an organic film may be included in the gas barrier film.

Here, tin oxide type film is defined that it has a composition which contained one element or more elements of additional elements selected from for example, Si, Ce, Ge, etc, in tin oxide.

By these additional elements, a tin oxide layer is made amorphous and a precise film is formed.

It is possible to use a composition such that the oxide film is formed on a base substrate wherein a gas barrier film that is one film or more films selected from a silicon oxide film, an silicon oxide nitride (SiON) film, an aluminum acid magnesium film, a tin oxide film, and a diamond-like carbon (DLC) film, and an organic film or a high polymer film are laminated repeatedly and alternately, on a surface of a resin base plate or a resin film.

The gas barrier film may be formed on one surface of the resin plate or the resin film. If it is formed on both surfaces, an interception function of gas passing becomes further better.

Further, by forming a gas barrier film on one surface side of the resin plate or the resin film, and further laminating the resin plate or the resin film on such gas barrier film, a composition in which the gas barrier film is inserted can be obtained.

Furthermore, it can be a composition in which laminating are made out repeatedly.

It is desired that the resin plate or the resin film consists of polyethylene terephthalate (PET), polyether sulfone (PES), polyarylate (PAR), polycarbonate (PC), or polyethylenenaphthalate (PEN), or lamination structure having a surface of such materials covered with acrylic organic substance. However, it is not limited within the scope mentioned above.

The thickness of the resin plate or the resin film is suitably selected according to the following concrete uses.

When using the transparent base material as an electrode of a device using LED, a laser, an organic or inorganic EL, which emits blue and near-ultraviolet light, It is industrially useful, since it becomes possible to obtain high light transmittance in a visible light short wavelength region as well as a near-ultraviolet light region of wavelength.

Further, it is useful when it is used as an electrode for elements of a self-luminescence type, such as an organic EL device etc., since an extraction efficiency of the light of the near-ultraviolet region can be raised.

Embodiment

Hereafter, the present invention will be explained more concretely by using embodiments.
1) Production of an Oxide Sintered Body The sintered body has been produced by an atmospheric pressure sintering method described below.

Gallium oxide powder and indium oxide powder of purity 4N were grinded by a ball mill and adjusted to the average particle diameter of 3 micrometers or less, respectively. Then, they were blended so that the atomic ratio of gallium to all metallic elements might become to a desired ratio, and mixed with the ball mill with an organic binder, a dispersant, and a plasticizer for 48 hours, and consequently slurry was produced.

Obtained slurry was dried out with a spray dryer, and granulation powder was produced.

Then, obtained granulation powder was put into a rubber mold, and a forming object with 191 mm $\phi$, thickness of about 6 mm was produced with a hydrostatic pressure pressing machine.

In an oxygen gas flow, the forming object obtained by the same way, was sintered under an ordinary pressure at a predetermined temperature (it is shown in an embodiment) for 20 hours.

In addition to the atmospheric pressure sintering method, the oxide sintered body was produced also by the hot pressing method.

Then, the gallium oxide powder and the indium oxide powder were blended so that the atomic ratio of gallium to all metallic elements might become to a desired ratio, and then, they were agitated by a three-dimensional mixer and precursor powder was produced.

By supplying mixed powders obtained into a container made of carbon, sintering was carried out using the hot pressing method under each of conditions.

In order to prevent degradation by oxidization of the container made of carbon, it was carried out in Ar gas atmosphere.

The pressure was fixed to 24.5 MPa, sintering temperature was made at a predetermined temperature (it is shown in an embodiment), and sintering time was set constant in 3 hours.

Then, circumference processing and surface grinding processing were given to the obtained sintered body, and it was made about 15.24 cm (6 inches) in diameter, and formed about 5 mm in thickness.

After the processing, bonding of the sintered body was carried out to a copper plate for cooling, and a sputtering target was obtained.

2) Production of a Thin Film

TOKU SPF-530H (manufactured by ANELVA) was used for sputtering equipment. A synthetic quartz plate was used as a substrate, and it was arranged so that it may become parallel to a target surface.

Distance between the substrate and the target was set to 60 mm.

Sputtering gas was mixed gas which consisted of argon and oxygen, and total gas pressure was set to 0.5 Pa while oxygen ratio was set to 1.0% to 2.0%.

Electrical power used was set to 200 W.

Film forming by direct-current magnetron sputtering was carried out under conditions mentioned above.

According to a target to be used, sputtering-time was adjusted and a thin film with 200 nm in thickness was formed.

In case that the direct current sputtering was unable to be used, the film was formed by sputtering of direct current pulsing method.

Other sputtering conditions were set to be equivalent to those of the direct current sputtering.

3) An Oxide Sintered Body and Thin Film Evaluation

As for the oxide sintered body and the thin film which were obtained, the atomic ratio of gallium to all metallic elements, was computed from weights of indium and gallium which were obtained by ICP emission spectral analysis method (SPS4000 made by Seiko Instruments Inc. was used).

The density of the oxide sintered body was measured using pure water by Archimedes method (Automatic Densimeter-H made by TOYO SEIKI SEISAKU-SHO, Ltd was used).

The film thickness of the oxide film was measured with a surface profiler (Alpha-Step IQ made by KLA-Tencor co., Ltd.).

The specific resistance of the oxide sintered body and the oxide film was computed from the surface resistance measured by the four-probe method (LORESTA-IP, MCP-T250 made by Mitsubishi Chemical was used).

The light transmittance ($T_{S+F}$ (%)) of the oxide film including the substrate was measured with a spectrophotometer (U-4000 made by the Hitachi, Ltd.).

Under the same conditions, the light transmittance ($T_S$ (%)) of a substrate only was also measured, and ($T_{S+F}/T_S$)×100 was computed as light transmittance ($T_F$ (%)) of the film itself excluding the substrate.

The X-ray diffractions of the oxide sintered body and the oxide film were measured with X-ray diffraction equipment (CuK α-rays made by the Rigaku Industrial Co. was used).

As to the oxide sintered body, a peak intensity was obtained by $In_2O_3$ phase (400), $β-Ga_2O_3$ phase (−202), $β-GaInO_3$ phase (111) and $(Ga, In)_2O_3$ phase (2 θ≈33°). Then, a peak intensity ratio of $In_2O_3$ phase (400) expressed by the following formula (1) was calculated.

$$In_2O_3 \text{ phase } (400)/\{β-Ga_2O_3 \text{ phase}(-202)+β-GaInO_3 \text{ phase } (111)+(Ga,In)_2O_3 \text{ phase}(2\ θ≈33°)\}×100\ [\%] \quad (1)$$

The arithmetic mean height (Ra) was measured by an atomic force microscope (Nanoscope III AFM, made by Digital Instruments Corp. was used).

Embodiments 1 and 2

Indium oxide powder and gallium oxide powder were blended so that the atomic ratio of gallium to all metallic elements might become 65.5 at. %, and the atmospheric pressure sintering was carried out under two conditions where sintering temperatures were at 1400° C. and 1500° C., and consequently, the sputtering target was produced.

Next, the direct current sputtering was tried at room temperature using these two kinds of sputtering targets.

An evaluation result of the targets was shown in FIG. 1.

As shown in FIG. 1, when the sintering temperature of the embodiment 1 was 1400° C., the atomic ratio of gallium to the all metallic elements of the obtained oxide sintered body was 65.6 at. %.

Here, the density of the oxide sintered body was 6.04 g/cm³, and the phase which constitutes the sintered body was $β-GaInO_3$ phase.

Therefore, the peak intensity ratio of $In_2O_3$ phase (400) expressed with the formula (1) mentioned above was 0%.

When the sintering temperature of the embodiment 2 was 1500° C., the atomic ratio of gallium to all metallic elements was 65.2 at. %, the density of the sintered body was 6.02 g/cm³, the formed phase was only $(Ga,In)_2O_3$ phase, and the peak intensity ratio of $In_2O_3$ phase (400) expressed with the formula (1) mentioned above was 0%.

When the direct current sputtering was carried out at room temperature using these two kinds of sputtering targets, any abnormalities, such as arc discharge, were not seen, and it was confirmed that the sputtering was successful.

Comparative Example 1

Except having set the atomic ratio of gallium to all metallic elements was 58.5 at. %, a sputtering target was produced as same to the embodiment 1, and direct current sputtering was tried.

The evaluation result of the target was shown in FIG. 2.

As shown in FIG. 2, in the comparative example 1, the atomic ratio of gallium to all metallic elements of the sintered body was 58.3 at. %, and the density of the sintered body was 6.28 g/cm³.

The sintered body is constituted by $β-GaInO_3$ phase and $In_2O_3$ phase, and the peak intensity ratio of $In_2O_3$ phase (400) expressed with the formula (1) mentioned above was 7%.

In the direct current sputtering at room temperature using the sputtering target, no abnormality such as arc discharge was seen, and it was confirmed that the sputtering was carried out successfully.

Embodiments 3 to 8

Indium oxide powder and gallium oxide powder were blended so that the atomic ratio of gallium to all metallic elements might vary 65.5~99 at. %, and sintering was carried out by the hot pressing method under three conditions of sintering temperature at 800° C.~100° C., and consequently, the sputtering target was produced.

Then, the direct current sputtering was tried at room temperature using these three kinds of sputtering targets.

An evaluation result of the targets was shown in FIG. 3.

As shown in FIG. 3, in the cases of Embodiments 3-8, the atomic ratio of gallium to all metallic elements was 65.4 to 99.1 at. %, and the density of the sintered body was 5.02 to 6.12 g/cm³, and consequently, good sintered body was obtained.

Next, it was confirmed that these sintered bodies are constituted by the $β-GaInO_3$ phase, $β-Ga_2O_3$, or the these two phases.

The peak intensity ratio of $In_2O_3$ phase (400) expressed with the above-mentioned formula (1) was 0% also in each of cases.

However, only in the embodiment 5, generation of $In_2O_3$ phase was seen, and the peak intensity ratio of $In_2O_3$ phase (400) expressed with the formula (1) mentioned above was 5%.

When the direct current sputtering was carried out at room temperature using these oxide sintered bodies as sputtering targets, in embodiments 3~7, namely, in a range where the atomic ratio of gallium to all metallic elements was 65.4~89.9 at. %, any abnormalities, such as arc discharge, were not seen, and it was confirmed that the sputtering was carried out successfully. However, in case that the atomic ratio of gallium to all metallic elements of the embodiment 8 was 99.1 at. %, the direct current sputtering method was not possible.

Comparative Example 2

Except that the hot pressing method was carried out at a sintering temperature of 1100° C., the sputtering target was produced as same as in embodiments 3 and 4, and the direct current sputtering method was tried.

An evaluation result of the target was shown in FIG. 4.

As shown in FIG. 4, the atomic ratio of gallium to all metallic elements was 65.3 at. % in the comparative example 2, but the density of the sintered body was low as 4.89 g/cm$^3$, and good sintered body was not able to be obtained.

A trace showing that during sintering Indium was melted and oozed was seen.

The sintered body is constituted by β-GaInO$_3$ phase, In phase, and In$_2$O$_3$ phase, and the peak intensity ratio of In$_2$O$_3$ phase (400) expressed with the formula (1) mentioned above was high, that is 12%.

This is presumed to be due to the melting and oozing of indium.

In the direct current sputtering at room temperature using the sputtering target, Arc discharge occurs frequently, and consequently good sputtering state was not acquired.

Embodiments 9 and 10

By using the sputtering target produced in embodiments 1 and 2, the direct current sputtering was carried out at the room temperature, and thin films were formed.

Evaluation results of the obtained films are shown in FIG. 5.

The atomic ratio of gallium to the all the metallic elements of the films obtained by the ICP emission spectral analysis method, were 65.6 at. % and 65.2 at. %, where the composition of the sputtering targets in embodiments 1 and 2 were reproduced.

The shortest wavelength where the light transmittance of the film itself excluding the substrate becomes 50% was 320 nm or less in each case.

As for the arithmetic mean height (Ra), it was confirmed that all were around 0.5 nm, and 1.0 nm or less.

As the result of the X-ray diffraction measurement of the obtained films, it was also confirmed that it was an amorphous film in each case.

It was shown that these films had electric conductivity and, the specific resistance of embodiment 9 and 10 were 7.1×10$^{-1}$ Ω·cm and 6.3×10$^{-1}$ Ω·cm, respectively.

Comparative Example 3

By using the sputtering target produced in the comparative example 1, the direct current sputtering was carried out at room temperature, and a thin film was formed.

An evaluation result of the obtained film is shown in FIG. 6.

The atomic ratio of gallium to the all metallic elements of the obtained film by the ICP emission spectral analysis method, was 58.7 at. %, where the composition of the sputtering target in the comparative example 1 was reproduced.

However, the shortest wavelength where the light transmittance of the film itself excluding the substrate becomes 50% was 332 nm. It did not become 320 nm or less.

However, as for the arithmetic mean height (Ra), it was confirmed that it was around 0.5 nm, and 1.0 nm or less.

As a result of the X-ray diffraction measurement of the obtained film, it was confirmed that it was an amorphous film.

It was shown that this film had conductivity and its specific resistance was 1.1×10$^{-1}$ Ω·cm.

Embodiments 11 to 14

In embodiments 4, and 6 to 8, the sputtering targets were produced by the hot pressing method on condition of a sintering temperature of 900° C. The direct current sputtering was carried out at the room temperature, and thin films were formed using them.

Since by the sputtering target of embodiment 8, the direct current sputtering was unable to be carried out, the thin film was formed by sputtering by the direct current pulsing method.

Evaluation results of the obtained thin films are shown in FIG. 7.

The atomic ratio of gallium to the all metallic elements of the thin films obtained by the ICP emission spectral analysis method, were 65.5 at. % to 99.5 at. %, where the composition of the sputtering targets in embodiments 4 to 7 were mostly reproduced.

The shortest wavelength where the light transmittance of the film itself excluding the substrate becomes 50% was 320 nm or less in each case.

Further, it was confirmed that the arithmetic mean height (Ra) is all around 0.5 nm, and it is 1.0 nm or less in each case.

It was confirmed, as a result of the X-ray diffraction measurement of the obtained film, that it was an amorphous film in each case.

It was shown that the film of embodiment 10 had electric conductivity and its specific resistance was 5.8×10$^{-1}$ Ω·cm.

However, it was not shown that other films had electric conductivity.

Comparative Example 4

By using the sputtering target produced in the comparative example 2, an oxide film was formed by sputtering.

However, since by the sputtering target of this comparative example 2, direct current sputtering could not be carried out, the thin film was formed by sputtering by a direct current pulsing method at room temperature.

An evaluation result of the obtained film is shown in FIG. 8.

As to the atomic ratio of gallium to all metallic elements of the thin film, which was obtained by the ICP emission spectral analysis method, it was 59.7 at. %, where gallium was less than composition of the sputtering target of the comparative example 2.

And, the shortest wavelength where the light transmittance of the film itself excluding the substrate becomes 50% was 340 nm, which did not become 320 nm or less.

However, as for the arithmetic mean height (Ra), it was confirmed that it was 0.62 nm, and 1.0 nm or less.

As a result of the X-ray diffraction measurement of the film obtained, it was confirmed that it was an amorphous film.

It was shown that this film had electrical conductivity and its specific resistance was $2.2 \times 10^1$ Ω·cm.

Embodiment 15

By using the sputtering target produced by the hot pressing method under condition of sintering temperature 1000° C. in embodiment 5, the direct current sputtering was carried out at room temperature, and a thin film was formed.

An evaluation result of the thin film obtained is shown in FIG. 9.

The atomic ratio of gallium to the all metallic elements of the thin film obtained by the ICP emission spectral analysis method, were 65.1 at. %, where the composition of the sputtering target in embodiment 5 was mostly reproduced.

The sputtering target of embodiment 5 contained indium oxide phase ($In_2O_3$ phase) of bixbyite-type structure, which was 5% in term of the peak intensity ratio of $In_2O_3$ phase (400) expressed with the formula (1) mentioned above. Nevertheless, the shortest wavelength where the light transmittance of the film itself excluding the substrate becomes 50% was 320 nm or less.

As for the arithmetic mean height (Ra), it was around 0.5 nm. Thus, it was confirmed that it was 1.0 nm or less.

As a result of the X-ray diffraction measurement of the film, it was confirmed that it was an amorphous film.

It was shown that the obtained film had electric conductivity and its specific resistance was $5.1 \times 10^{-1}$ Ω·cm.

Embodiment 16

Except that PET film (made by Toyobo Co., Ltd.) having 100 μm in thickness was used for a substrate, a thin film was formed on one of surfaces of the PET film under the same conditions as embodiment 9.

It was confirmed, by X-ray diffraction like in embodiment 9, that an obtained transparent conductive oxide film was an amorphous film.

As shown in embodiment 9, the shortest wavelength where the light transmittance of the film itself excluding substrate becomes 50% was 320 nm or less. Nevertheless, the shortest wavelength where the light transmittance becomes 50% when the PET film was included was 324 nm, which was equivalent to 322 nm in case of the PET film itself.

It was confirmed that the arithmetic mean height (Ra) was 1.0 nm or less.

Embodiment 17

Except that a substrate having a barrier film in which a silicon-oxide-nitride film was formed on both surfaces of the PES film (made by Sumitomo Bakelite Co., Ltd.) of 200 μm in thickness was used as a substrate, a film was formed on both of surfaces of the film under the same conditions as embodiment 12.

It was confirmed, by X-ray diffraction like in the embodiment 12, that the obtained transparent electric conduction film was an amorphous film.

As shown in embodiment 12, the shortest wavelength where the light transmittance of the film itself except the substrate becomes 50% was 320 nm or less. Nevertheless, the shortest wavelength where the light transmittance becomes 50% when the PES film was included was 350 nm, which was equivalent to 350 nm in case of the PES film itself.

It was confirmed that the arithmetic mean height (Ra) was 1.0 nm or less.

Evaluation

From results in embodiments 1 to 8, it has been clear that no abnormal electric discharge such as arc discharge etc., occurs, and accordingly a good sputtering can be achieved, when a sputtering is carried out using as a sputtering target, the oxide sintered body of the present invention characterized in that an oxide sintered body which mainly consists of gallium, indium, and oxygen, wherein a content of which is more than 65 at. % and less than 100 at. % with respect to all metallic elements, and the density of the sintered body is 5.0 g/cm³ or more.

In particular, from results of embodiments 1 to 7, it has been clear that no abnormal electric discharge such as arc discharge etc., occurs, and accordingly a good sputtering can be achieved, when the sputtering is carried out using as a sputtering target, an oxide sintered body of the present invention characterized in that an oxide sintered body wherein a content of gallium of the present invention is more than 65 at. % and less than 90 at. % with respect to all metallic elements, and the density of the sintered body is 5.5 g/cm³ or more.

From the result of embodiments 3 to 8, it has been clear that no abnormal electrical discharge such as arc discharge etc., occurs, and accordingly the direct current sputtering can be carried out successfully, when an oxide sintered body of the present invention is used as a sputtering target, that is characterized in that an oxide sintered body which is sintered by the hot pressing method in an inert gas atmosphere under conditions in which sintering temperature is 800° C.~1000° C. and sintering pressure is 4.9 MPa~29.4 MPa, and it does not contain metal indium phase.

Next, from the result of embodiments 9 to 15, it has been shown that the oxide film of the present invention namely, an oxide film obtained by using a sputtering method, wherein the oxide sintered body according to embodiments 9 to 15 is used as a sputtering target, is an oxide film which consists of gallium, indium, and oxygen, wherein the oxide film has gallium, a content of which is more than 65 at. % and less than 100 at. % with respect to all metallic elements, and a shortest wavelength where the light transmittance of the film itself excluding a substrate becomes 50%, is 320 nm or less, and it is an amorphous film and its arithmetic mean height (Ra) is 1.0 nm or less.

In particular, from embodiment 15, it has been shown that the shortest wavelength where the light transmittance of the film itself excluding a substrate becomes 50% is 320 nm or less, if an oxide film is obtained by using as a sputtering target, the oxide sintered body according to the present invention, that is, an oxide sintered body characterized in that it has one phase or more phases selected from a gallium-oxide phase which has β-$Ga_2O_3$ type structure (β-$Ga_2O_3$ phase), an gallium indium oxide phase having β-$Ga_2O_3$ type structure (β-$GaInO_3$ phase), or (Ga, In)$_2O_3$ phases, wherein it is constituted by an indium oxide phase ($In_2O_3$ phase) of bixbyite-type structure, and a ratio of the contained indium oxide phase ($In_2O_3$ phase) in the bixbyite-type structure is 5% or less in term of the X-ray diffraction peak intensity ratio defined by the following formula (1), $$In_2O_3 \text{ phase } (400)/\{β\text{-}Ga_2O_3 \text{ phase }(-202)+β\text{-}GaInO_3 \text{ phase}(111)+(Ga,In)_2O_3 \text{ phase } (2θ≈33°)\} \times 100 \; [\%] \quad (1)$$

Contrary to this, it has been shown that in case of the oxide film in the comparative example 3, that is, an oxide film obtained by the sputtering method, using as a sputtering target, an oxide sintered body which does not satisfy the composition range of the comparative example 1, the shortest wavelength where the light transmittance of the film itself excluding a substrate becomes 50% exceeds 320 nm.

It has been shown also that the shortest wavelength where the light transmittance of the film itself excluding a substrate becomes 50% exceeds 320 nm with respect to an oxide film obtained by the sputtering method, by using as a sputtering target, an oxide sintered body in which the hot press conditions of the comparative example 1 are not satisfied, and the ratio of the contained indium oxide phase ($In_2O_3$ phase) having the bixbyite-type structure exceeds 5%.

From embodiments 16 and 17, it has been confirmed that the transparent base material according to the present invention, that is, the transparent base material characterized in that the oxide film of the present invention is formed on one surface or both surfaces of a transparent plate of a resin film wherein one surface or both surfaces are covered with a gas barrier film can be obtained.

What is claimed is:

1. An oxide film, which is obtained by a sputtering method by using an oxide sintered body which comprises gallium, indium, and oxygen, with a content of the gallium being more than 65 at. % and less than 100 at. % with respect to all metallic elements, the oxide sintered body having one or more phases selected from a gallium oxide phase having $\beta$-$Ga_2O_3$ type structure ($\beta$-$Ga_2O_3$ phase), a gallium indium oxide phase having $\beta$-$Ga_2O_2$ type structure ($\beta$-$Ga_2InO_3$ phase) or $(Ga,In)_2O_3$ phase, the oxide sintered body having an indium oxide phase ($In_2O_3$ phase) of the bixbyite-type structure, and wherein a ratio in which the indium oxide phase ($In_2O_3$ phase) of the bixbyite-type structure contained is 5% or less in terms of an X-ray diffraction peak intensity ratio defined by the following formula (1), and which has a density being 5.0 g/cm$^3$ or more, as a sputtering target, wherein the oxide film comprises gallium, indium and oxygen, with a content of the gallium being more than 65 at. % and less than 100 at. % with respect to all metallic elements, and a shortest wavelength at which light transmittance of the film itself, excluding a substrate, becomes 50% is 320 nm or less:

$$In_2O_3 \text{ phase } (400)/\{\beta\text{-}Ga_2O_2 \text{ phase } (-202)+\beta\text{-}GaInO_3 \text{ phase } (111)+(Ga,In)_2O_3 \text{ phase } (2\theta=33°)\}\times 100 \text{ [\%]} \quad (1).$$

2. The oxide film according to claim 1, wherein the oxide film is an amorphous film.

3. The oxide film according to claim 1, wherein an arithmetic mean height (Ra) is 1.0 nm or less.

4. A transparent base material comprising:

an oxide film obtained by a sputtering method by using an oxide sintered body as a sputtering target, wherein 320 nm is a shortest wavelength at which light transmittance of the film, excluding a substrate, becomes 50%, a glass plate, a quartz plate, a resin plate or a resin film on which the oxide film is formed, and a gas barrier film covering one surface or both surfaces of the glass plate, quartz plate, resin plate, or inserted inside a transparent plate on which the oxide film is formed on one surface or both surfaces thereof, the transparent plate being selected from a resin plate or a resin film with the gas barrier film being inside, wherein the oxide sintered body comprises gallium, indium and oxygen, with a content of the gallium being more than 65 at. % and less than 100 at. % with respect to all metallic elements, the oxide sintered body having one or more phases selected from a gallium oxide phase having $\beta$-$Ga_2O_3$ type structure ($\beta$-$Ga_2O_3$ phase), a gallium indium oxide phase having $\beta$-$Ga_2O_3$ type structure (($\beta$-$Ga_2InO_3$ phase) or $(Ga,In)_2O_3$ phase, the oxide sintered body having an indium oxide phase ($In_2O_3$ phase) of the bixbyite-type structure, and wherein a ratio in which the indium oxide phase ($In_2O_3$ phase) of the bixbyite-type structure contained is 5% or less in terms of an X-ray diffraction peak intensity ratio defined by the following formula (1), and which has a density of 5.0 g/cm$^3$ or more, as a sputtering target, wherein the oxide film comprises gallium, indium and oxygen, with a content of the gallium being more than 65 at. % and less than 100 at. % with respect to all metallic elements, and a shortest wavelength at which light transmittance of the film itself, excluding a substrate, becomes 50% is 320 nm or less:

$$In_2O_3 \text{ phase } (400)/\{\beta\text{-}Ga_2O_2 \text{ phase } (-202)+\beta\text{-}GaInO_3 \text{ phase } (111)+(Ga,In)_2O_3 \text{ phase } (2\theta=33°)\}\times 100 \text{ [\%]} \quad (1).$$

5. The transparent base material according to claim 4, wherein the gas barrier film is constituted by one or more films selected from silicon oxide film, a silicon oxide nitride (SiON) film, an aluminum acid magnesium film, a tin oxide type film, and a diamond-like carbon (DLC) film.

6. The transparent base material according to claim 5, wherein the material of the resin plate or the resin film is polyethylene terephthalate (PET), polyether sulfone (PES), polyarylate (PAR), polycarbonate (PC), or polyethylene naphthalate (PEN), or it comprises lamination structure having a surface of such material covered with an acrylic organic substance.

7. The oxide film according to claim 2, wherein an arithmetic mean height (Ra) is 1.0 nm or less.

* * * * *